(12) United States Patent
Tofilescu et al.

(10) Patent No.: US 9,682,672 B2
(45) Date of Patent: Jun. 20, 2017

(54) DEVICE AND METHOD FOR CURRENT FLOW CONTROL FOR DUAL BATTERY VEHICLE ARCHITECTURE

(71) Applicant: Flextronics AP, LLC, San Jose, CA (US)

(72) Inventors: Pompilian Tofilescu, Toronto (CA); Reginald C. Grills, Oshawa (CA)

(73) Assignee: Flextronics AP, LLC, San Jose, CA (US)

( * ) Notice: Subject to any disclaimer, the term of this patent is extended or adjusted under 35 U.S.C. 154(b) by 259 days.

(21) Appl. No.: 14/333,659

(22) Filed: Jul. 17, 2014

(65) Prior Publication Data

US 2015/0076899 A1    Mar. 19, 2015

Related U.S. Application Data

(60) Provisional application No. 61/879,405, filed on Sep. 18, 2013.

(51) Int. Cl.
    *B60R 16/033* (2006.01)
    *B60R 16/04* (2006.01)
    (Continued)

(52) U.S. Cl.
    CPC ........ *B60R 16/033* (2013.01); *B60R 16/0232* (2013.01); *B60R 16/03* (2013.01); *F02N 11/0814* (2013.01); *F02N 11/0866* (2013.01); *H03K 17/0822* (2013.01); *F02N 2200/043* (2013.01); *F02N 2200/044* (2013.01);
    (Continued)

(58) Field of Classification Search
    CPC ............................. B60R 16/033; B60R 16/03
    See application file for complete search history.

(56) References Cited

U.S. PATENT DOCUMENTS 6,922,322 B2 *   7/2005   Strayer ............... H02H 11/003
                                                        361/111
2011/0012424 A1 *   1/2011   Wortberg ................. H02J 1/08
                                                        307/10.1

(Continued)

FOREIGN PATENT DOCUMENTS

| CN | 101911474 A | 12/2010 |
|---|---|---|
| CN | 102084574 A | 6/2011 |
| DE | 102008054885 A1 | 6/2010 |

*Primary Examiner* — Jared Fureman
*Assistant Examiner* — Fan He
(74) *Attorney, Agent, or Firm* — Volpe and Koenig, P.C.

(57) ABSTRACT

Described herein is a device and method for current flow control for dual battery vehicle architecture. The dual battery vehicle architecture includes a second energy source that is used to support electrical loads, such as radio and navigation systems, during re-cranking in stop-start situations. A quasi-diode device is configured to effectively split a main battery and starter circuit from the rest of the vehicle electrical system including the second energy source. The quasi-diode device includes a plurality of field effect transistors (FET) that conducts current in both directions between the main battery and starter circuit and the rest of the vehicle electrical system when the FETs are turned on and conducts current only from the main battery and starter circuit to the rest of the vehicle electrical system when the FETs are turned off, i.e. when re-cranking is occurring during a start-stop situation.

20 Claims, 9 Drawing Sheets

(51) Int. Cl.
*F02N 11/08* (2006.01)
*H03K 17/082* (2006.01)
*B60R 16/023* (2006.01)
*B60R 16/03* (2006.01)
*H02J 7/14* (2006.01)

(52) U.S. Cl.
CPC .. *F02N 2200/062* (2013.01); *F02N 2200/063* (2013.01); *F02N 2300/106* (2013.01); *H02J 7/1423* (2013.01); *Y02T 10/48* (2013.01)

(56) References Cited

U.S. PATENT DOCUMENTS

| | | | | |
|---|---|---|---|---|
| 2011/0110002 | A1* | 5/2011 | Ooshima | H02P 7/29 361/33 |
| 2013/0026151 | A1* | 1/2013 | Adachi | B60H 1/2221 219/202 |
| 2016/0001661 | A1* | 1/2016 | Hatanaka | H02M 1/44 307/10.1 |

* cited by examiner

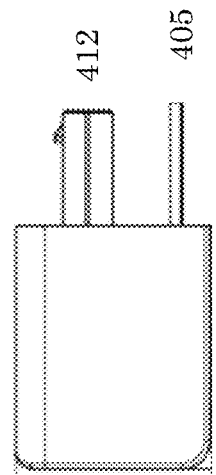
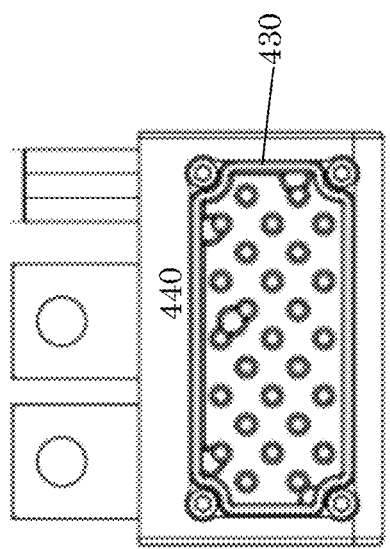
Figure 4B
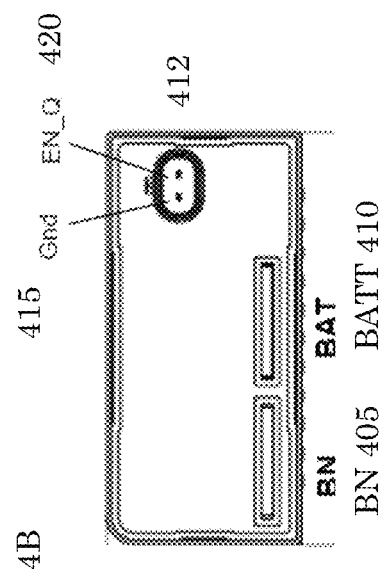
Figure 4C
Figure 4A

DEVICE AND METHOD FOR CURRENT FLOW CONTROL FOR DUAL BATTERY VEHICLE ARCHITECTURE

CROSS REFERENCE TO RELATED APPLICATIONS

This application claims the benefit of U.S. provisional application No. 61/879,405, filed Sep. 18, 2013, the contents of which are hereby incorporated by reference herein.

FIELD OF INVENTION

This application is related to vehicle electronics.

BACKGROUND

Some vehicles now have stop-start systems that automatically limit idling in a motionless vehicle. In particular, when the vehicle comes to a stop, the engine computer or control unit stops sparking and providing fuel. When the driver lifts his or her foot off the brake, or engages the clutch, the engine fires back up. In these stop-start situations, current is drawn from the overall vehicle electrical systems when re-cranking the vehicle through the main battery and starter circuit. This may cause brown out conditions with respect to the overall vehicle electrical systems, such as the radio, navigation and or other vehicle electrical systems.

SUMMARY

Described herein is a device and method for current flow control for dual battery vehicle architecture. The dual battery vehicle architecture includes a second energy source that is used to support electrical loads, such as radio and navigation systems, during re-cranking in stop-start situations. A quasi-diode device is configured to effectively split a main battery and starter circuit from the rest of the vehicle electrical system including the second energy source. The quasi-diode device includes a plurality of field effect transistors (FET) that conducts current in both directions between the main battery and starter circuit and the rest of the vehicle electrical system when the FETs are turned on and conducts current only from the main battery and starter circuit to the rest of the vehicle electrical system when the FETs are turned off, i.e. when re-cranking is occurring during a start-stop situation.

BRIEF DESCRIPTION OF THE DRAWINGS

FIGS. 4A-4C show an example schematic for a quasi-diode device in accordance with one or more disclosed embodiments;

DETAILED DESCRIPTION

Figure 1:
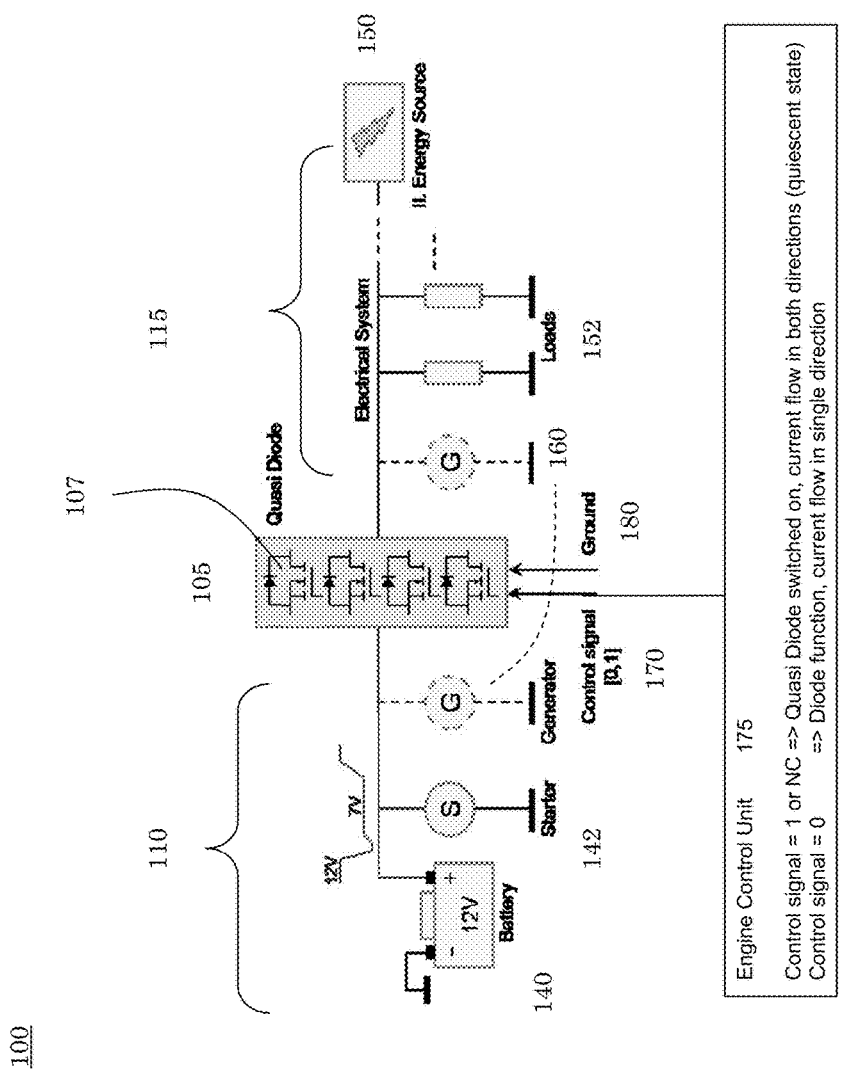
FIG. 1 shows an example dual battery vehicle architecture and circuit in accordance with one or more disclosed embodiments.

It is to be understood that the figures and descriptions of embodiments of the quasi-diode device and associated circuitry have been simplified to illustrate elements that are relevant for a clear understanding, while eliminating, for the purpose of clarity, many other elements found in typical technology. Those of ordinary skill in the art may recognize that other elements and/or steps are desirable and/or required in implementing the quasi-diode device and associated circuitry. However, because such elements and steps are well known in the art, and because they do not facilitate a better understanding of the quasi diode device and associated circuitry, a discussion of such elements and steps is not provided herein.

The non-limiting embodiments described herein are with respect to the quasi diode device and associated circuitry. The embodiments and variations described herein, and/or shown in the drawings, are presented by way of example only and are not limiting as to the scope and spirit. The quasi diode device and associated circuitry may be used in a number of applications.

In general, in a dual battery vehicle architecture or system, a quasi-diode device is configured to effectively split a main battery and starter circuit from the rest of the vehicle electrical system including a second energy source. The quasi-diode device includes a plurality of field effect transistors (FET) that conducts current in both directions between the main battery and starter circuit and the rest of the vehicle electrical system when the FETs are turned on and conducts current only from the main battery and starter circuit to the rest of the vehicle electrical system when the FETs are turned off, i.e. when re-cranking is occurring during a start-stop situation. The quasi-diode device limits the voltage drop at the second energy source during re-cranking and prevents current from being drawn from the overall electrical system to the main battery and starter circuit.

In comparison to a simple semiconductor diode, the quasi-diode device uses FETs to conduct current and therefore has lower voltage drops and less power losses, which eliminate the need for costly heat sinking. In addition, as compared to an electromechanical solution, (such as a relay), the quasi-diode device offers higher life cycles and noiseless operation.

FIG. 1 shows an example dual cell system 100 using a quasi-diode device 105 connected between a main battery and starter circuit 110 and a remaining vehicle electrical system 115. The main battery and starter circuit 110 includes at least a battery 140 and a starter 142. The remaining vehicle electrical system 115 includes at least a second energy source 150 and loads 152. A generator 160 may be part of the main battery and starter circuit 110 or the remaining vehicle electrical system 115, depending on vehicle system implementation.

The quasi-diode device 105 includes four (4) N-channel FETs 107 that are connected in parallel. Although N-channel FETs are used in the description herein of the quasi-diode device, P-channel FETs may also be used without deviating from the scope of the invention described herein. The quasi-diode device 105 has an enable control signal 170 provided by an engine control unit 175 for turning or switching the quasi-diode device 105 on or off in accordance with engine re-start conditions. In a diode emulation mode, when the enable control signal 170 is low, the quasi-diode device 105 is off and current flows from the main battery and starter circuit 110 to the remaining vehicle electrical system 115. In an ON state, when the enable control signal 170 is high or not connected, the quasi-diode device 105 is on and current flows in both directions between the main battery and starter circuit 110 and the remaining vehicle electrical system 115. Although the quasi-diode device 105 is described herein below with respect to an active low enable control signal, an active high enable control signal may be used without deviating from the scope of the invention described herein. As further described herein below, during cranking, no current is nominally flowing through the quasi-diode device while the voltage at the main battery and starter circuit 110 is lower than the remaining vehicle electrical system 115. A ground path 180 is provided for the dual cell system 100.

In an embodiment, the quasi-diode device 105 may be implemented by 4 OptiMOS™ N-channel 0.9 mΩ transistors connected in parallel, (OptiMOS™ is a trademark of Infineon Technologies), where illustrative operating characteristics and/or features are noted in Table 1.

TABLE 1

4 OptiMOS N-channel 0.9 mΩ transistors connected in parallel
Operating temperature range: −40° C. . . . 105° C.
Maximum continuous Load Current:
        200 A @ Ta = 25° C.
        160 A @ Ta = 105° C.
Maximum Body Diode conduction current:
        50 A @ Ta = 25° C.
        20 A @ Ta = 105° C.
Increase in Tj during transient peak current (if the application requires the QD to be ON during cold crank): 45° C. maximum
Quiescent Current Consumption: 280 μA - measured @ 12 V & 25° C. (QD ON state)
Current Consumption Diode Emulation state = 4.38 mA - measured @ 12 V & 25° C.
QDiode Ron: ~330 μΩ - measured @ Ta = 25° C.
Short to ground protection:
    Starter side - YES: QD turns/stays off if V_BAT goes below V_BN/2 - adjustable.
    Boardnet side - NO (due to direct conduction through the body diodes)

Note:
The numbers shown above are illustrative and are for purposes of example only.

Figure 2:
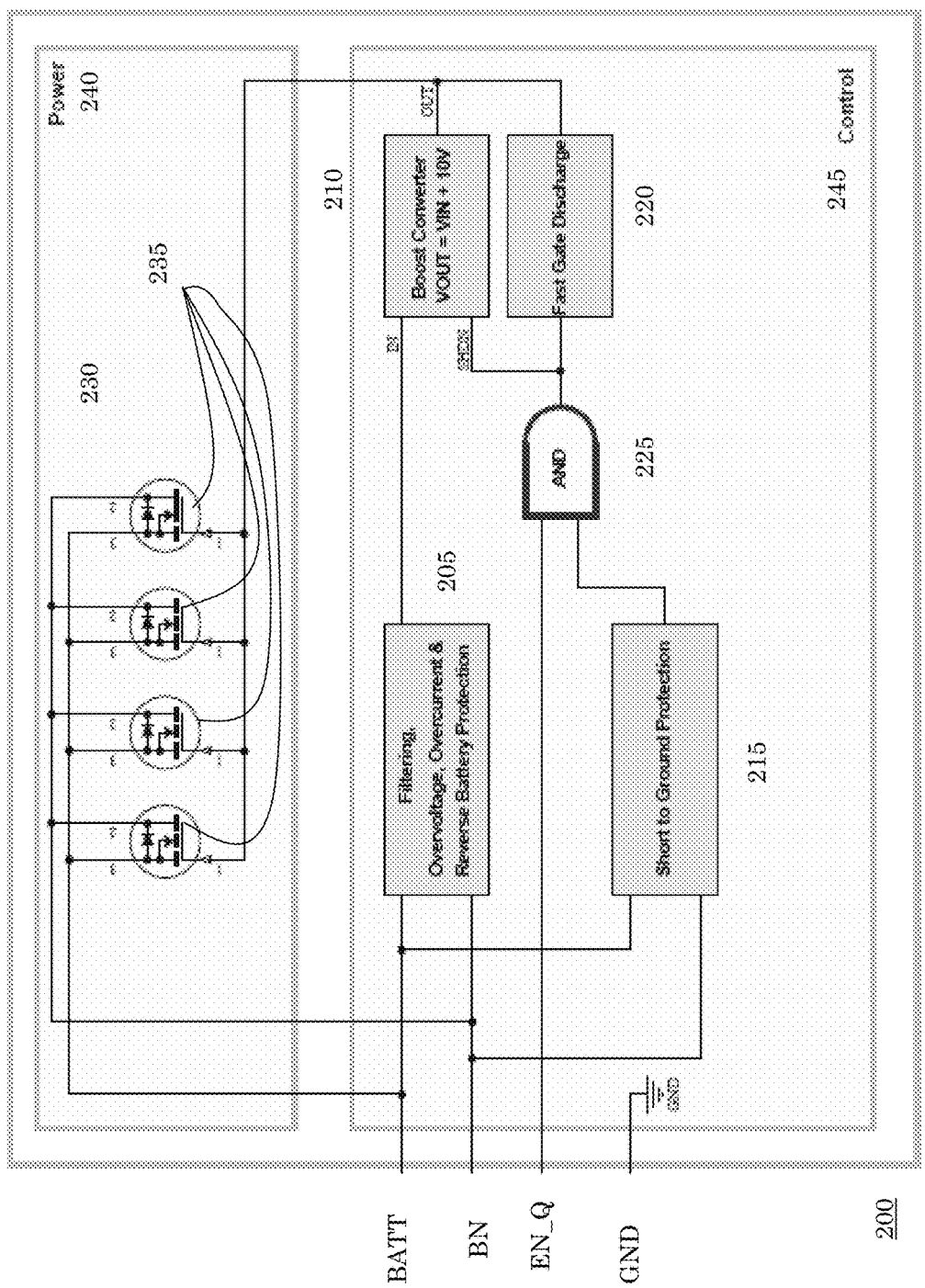
FIG. 2 shows an example high level block diagram of a quasi-diode device in accordance with one or more disclosed embodiments.

FIG. 2 shows a high level block diagram of a quasi-diode module 200 that has four input signals: 1) an enable control signal, EN_Q, which is the quasi-diode device 200 control signal and in this illustrative embodiment, is active low; 2) a ground path, GND; 3) a battery current connection, BATT; and 4) a remaining vehicle electrical system current connection, which is also known as boardnet, BN. The quasi-diode module 200 includes a filtering module 205 connected to a boost converter module 210, a protection module 215 connected to the boost converter module 210 and a fast gate discharge 220 via an AND logic gate 225. The boost converter module 210 is further connected to a quasi-diode device 230. The quasi-device diode 230 includes a plurality of FETs 235 that are connected in parallel.

The BATT is connected to a source (3) of each of the plurality of FETs 235 and the BN is connected to a drain (2) of each of the plurality of FETs 235. The BATT and BN are also connected to the filtering module 205 and the protection module 215. The control signal EN_Q and the output of the protection module 215 are connected to the AND logic gate 225. The output of the AND logic gate 225, control signal shutdown (SHDN), is connected to the boost converter module 210 and the fast gate discharge 220. The outputs of the boost converter module 210 and the fast gate discharge 220 are connected to a gate (1) of each of the plurality of FETs 235. In an embodiment, as further described herein below, the quasi-diode device 230 may be implemented on a power board 240 and the filtering module 205, the protection module 215, the boost converter module 210, fast gate discharge module 220 and the AND logic gate may be implemented on a control board 245.

Operationally, the filtering module 205 performs standard filtering, and overvoltage, overcurrent and reverse battery protection with respect to BATT and BN. To turn the quasi-diode device 230 on, the control signal EN_Q is high or not connected and the gate voltage must be greater than the source voltage, which as described herein above is tied to BATT. This is accomplished by the boost converter module 210, which takes the voltage coming out of the filtering module 205 and boosts the voltage by a predetermined voltage. This boosted voltage then becomes the gate voltage. In an embodiment, the predetermined voltage is ten (10) volts.

The quasi-diode device 230 may be in one of three modes or states, an ON-state, a diode emulation state or a short circuit state. In the diode emulation state, the control signal EN_Q signal is low, the control signal SHDN is active and the boost converter module 210 is inactive or off. Consequently, the quasi-diode device 230 is off. In this mode, the plurality of FETs 235 emulates ideal diode function, that is, current is only allowed to flow from the main battery and starter circuit 110 to the remaining vehicle electrical system 115 as shown in FIG. 1.

Figure 3:
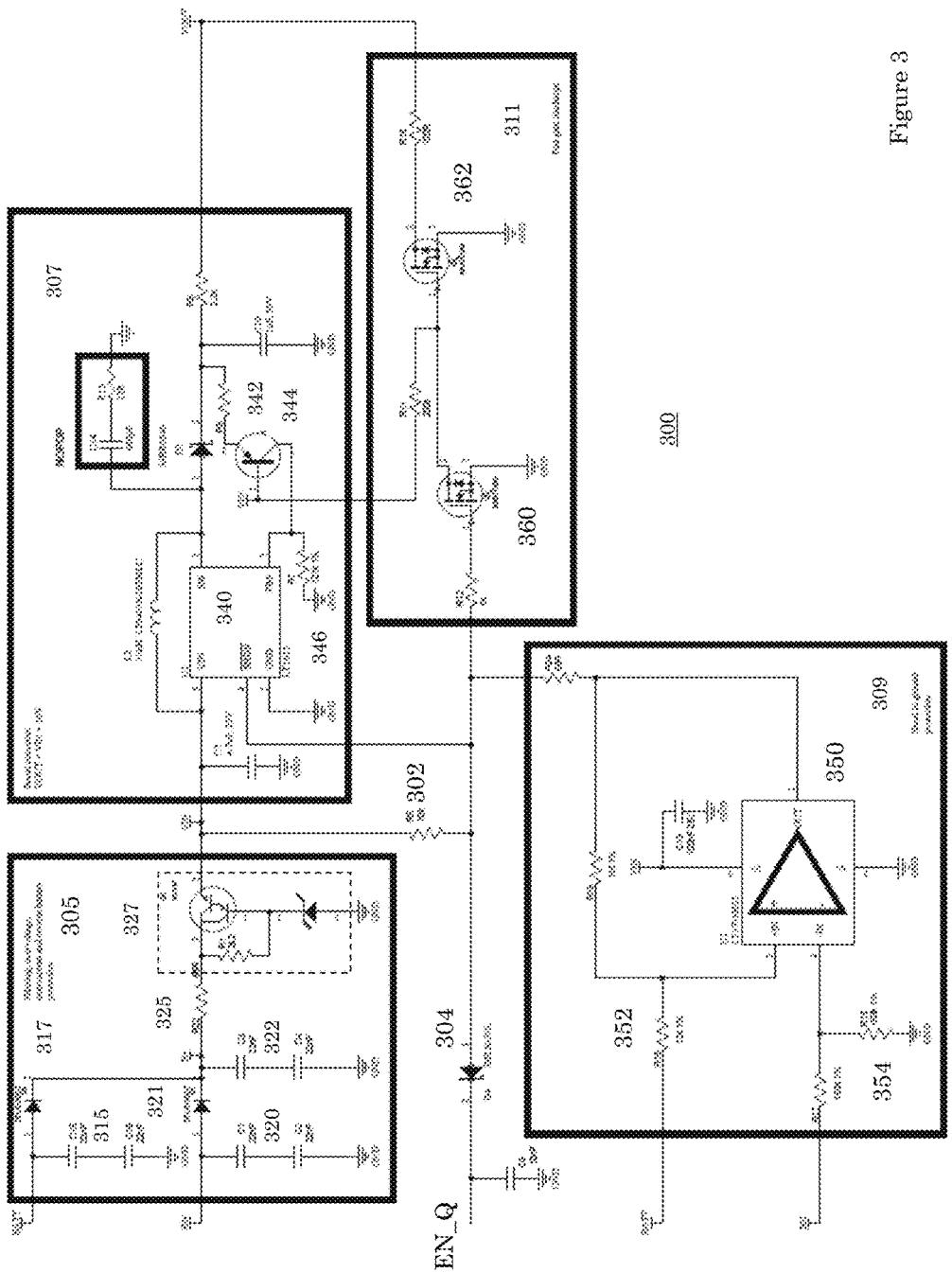
FIG. 3 shows an example circuit diagram of a quasi-diode device in accordance with one or more disclosed embodiments.

In the ON-state, the control signal EN_Q is high or not connected (NC), and the quasi-diode device 230 is in an ON-state as long as the BATT voltage is higher than a predetermined value of the BN. Once a short circuit condition is detected while the control signal EN_Q is high or not connected and the BN voltage becomes higher than the BATT voltage, then the quasi-diode device 230 switches from an ON-state to a short circuit state in order to protect itself from being damaged. In the short circuit state, the FETs 235 are switched-off. The quasi-diode device 230 resides in this state until the short-circuit situation is rectified. In an embodiment, the short circuit threshold is when the BATT voltage is equal to or higher than half the BN voltage. The short circuit functionality is implemented by the protection module 215, which causes the control signal SHDN to be low in the event of a short circuit. As shown in FIG. 3, the short circuit threshold can be set up by a resistive divider ratio at the input of a comparator circuit in an example embodiment. Short circuits to ground are detected only at the main battery and starter circuit 110 (BATT) as shown in FIG. 1. A short circuit (to ground) detection at the remaining vehicle electrical system 115 (BN) is rendered ineffective by the fact that current flow in the BN direction cannot be blocked.

In the event of a short circuit, the power in the quasi-diode device 230 must be dissipated quickly or the FETs 235 may be damaged. This is implemented by the fast gate discharge module 220, which establishes a path to ground when the control signal SHDN is low.

FIG. 3 shows an example circuit diagram for a quasi-diode module 300 including example circuits for a filtering circuit 305, a boost converter circuit 307, a protection circuit 309 and a fast gate discharge circuit 311. The control signal EN_Q is pulled up with 10 k resistor 302 through a protection diode 304.

The filtering circuit 305 has a battery current connection, BATT, tied to a capacitor circuit 315 and a diode 317, and a boardnet current connection, BN, tied to a capacitor circuit 320 and a diode 321. The capacitor circuit 315 and capacitor circuit 320 provide electromagnetic interference (EMI) filtering and electrostatic discharge (ESD) protection. The diodes 317 and 321 provide reverse battery protection. The outputs of the diodes 317 and 321 are tied together at a node B+. The capacitor circuit 322 provides further EMI filtering. The node B+ represents a voltage net and is the supply voltage after the reverse polarity protection. The B+ node is connected to a current limiting resistor 325, which provides overcurrent protection. The other end of current limiting resistor 325 is connected to a circuit 327 which provides over-voltage protection.

The boost converter circuit 307 uses a switch mode step-up circuit 340 which has a $V_{IN}$ pin connected to the output of the filtering circuit 305 and a SHDN pin connected to an output of the protection circuit 309 and the control signal EN_Q. The switch mode step-up circuit 340 is, for example, a micropower step-up DC/DC converter. The output of the boost converter circuit 307 is set by resistor 342, transistor 346 and resistor 346 to $V_{IN}$+10V. The voltage offset, i.e. 10V in this example, can be set by changing the values of resistor 342, transistor 346 and resistor 346.

The protection circuit 309 includes a conventionally configured comparator circuit 350 which has BATT and BN connected as inputs via resistor network circuits 352 and 354, respectively. As described herein above, the resistor network circuits 352 and 354 can be configured to establish the short circuit threshold. The output of the protection circuit 309 is connected to the switch mode step-up circuit 340 and to the fast gate discharge circuit 311.

The fast gate discharge circuit 311 has two (2) N-channel FETs 360 and 362, respectively, which provide a path to ground in the event of a short circuit, i.e. when control signal SHDN is low and active. The purpose of the fast gate discharge circuit 311 is to turn off the 4 FETs, e.g. the plurality of FETs 235 in FIG. 2, very fast. This is accomplished by providing a path to discharge to ground the 4 FETs gate charge. As described herein above, this happens when the quasi-diode device is on. This fast discharge is activated at the same time with turning the boost converter circuit 307 off, (i.e. pulling SHDN low), and is done either by EN_Q going low or in case of short circuit when the protection circuit 309 is triggered.

FIGS. 4A, 4B and 4C show example packaging schematic diagrams for a quasi-diode module 400 in accordance with one or more disclosed embodiments. In particular, FIG. 4A shows a direct view of a BN connector 405, a BATT connector 410, and connector port 412 including a ground pin 415 and a control signal EN_Q pin 420. FIG. 4B shows a bottom view of the quasi-diode module 400 including a view of a rubber grommet 430 for environmental sealing and a heat sink 440. FIG. 4C shows a side view of the BN connector 405 and the connector port 412.

Figure 5:
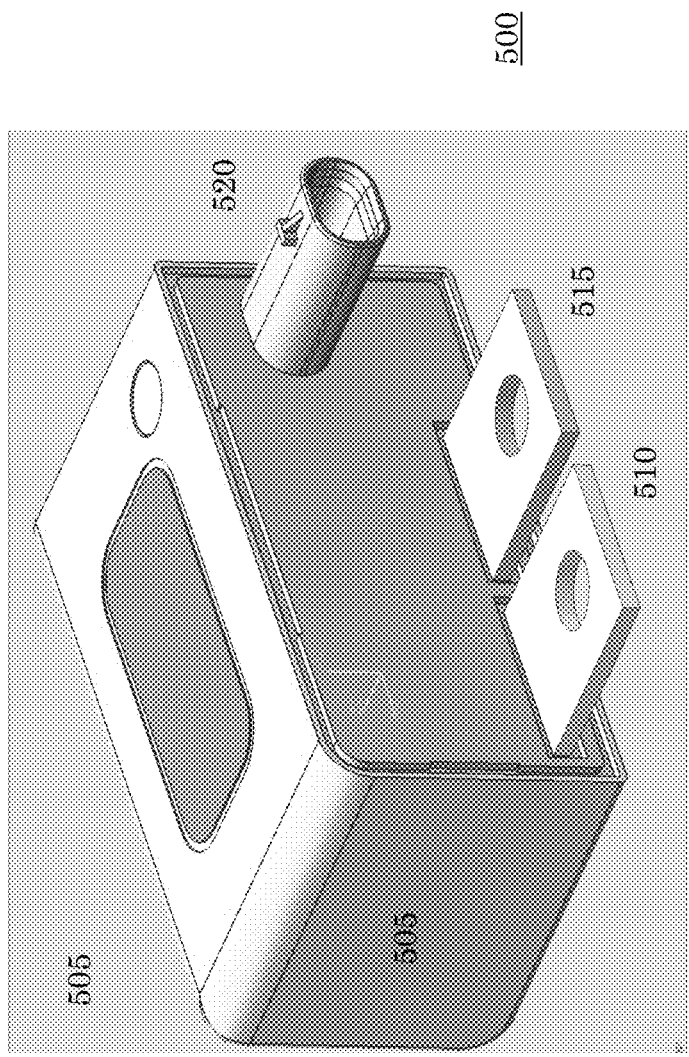
FIG. 5 shows an example view of a quasi-diode device in accordance with one or more disclosed embodiments.

FIG. 5 shows an example view of a quasi-diode module 500 in accordance with one or more disclosed embodiments. In particular, a housing or enclosure 505 is shown with a BN connector 510, a BATT connector 515, and connector port 520.

Figure 6:
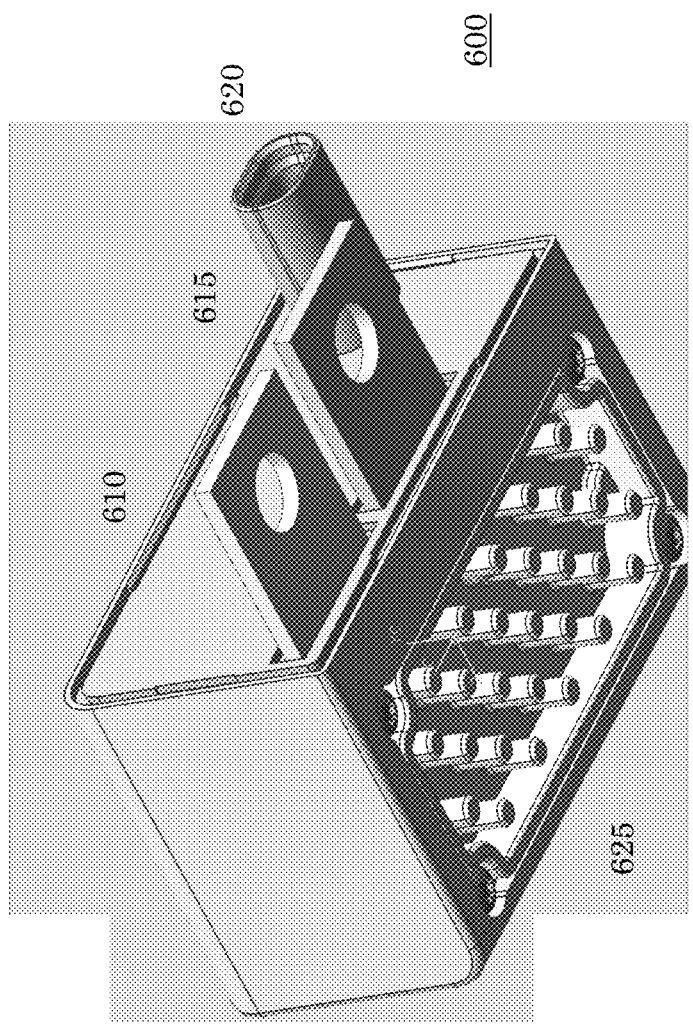
FIG. 6 shows an example perspective view of a quasi-diode device in accordance with one or more disclosed embodiments.

FIG. 6 shows an example perspective view of a quasi-diode module 600 in accordance with one or more disclosed embodiments and in particular, a bottom view of the embodiment shown in FIG. 5. A BN connector 610, a BATT connector 615, a connector port 620 and a heat sink 625 are shown.

Figure 7:
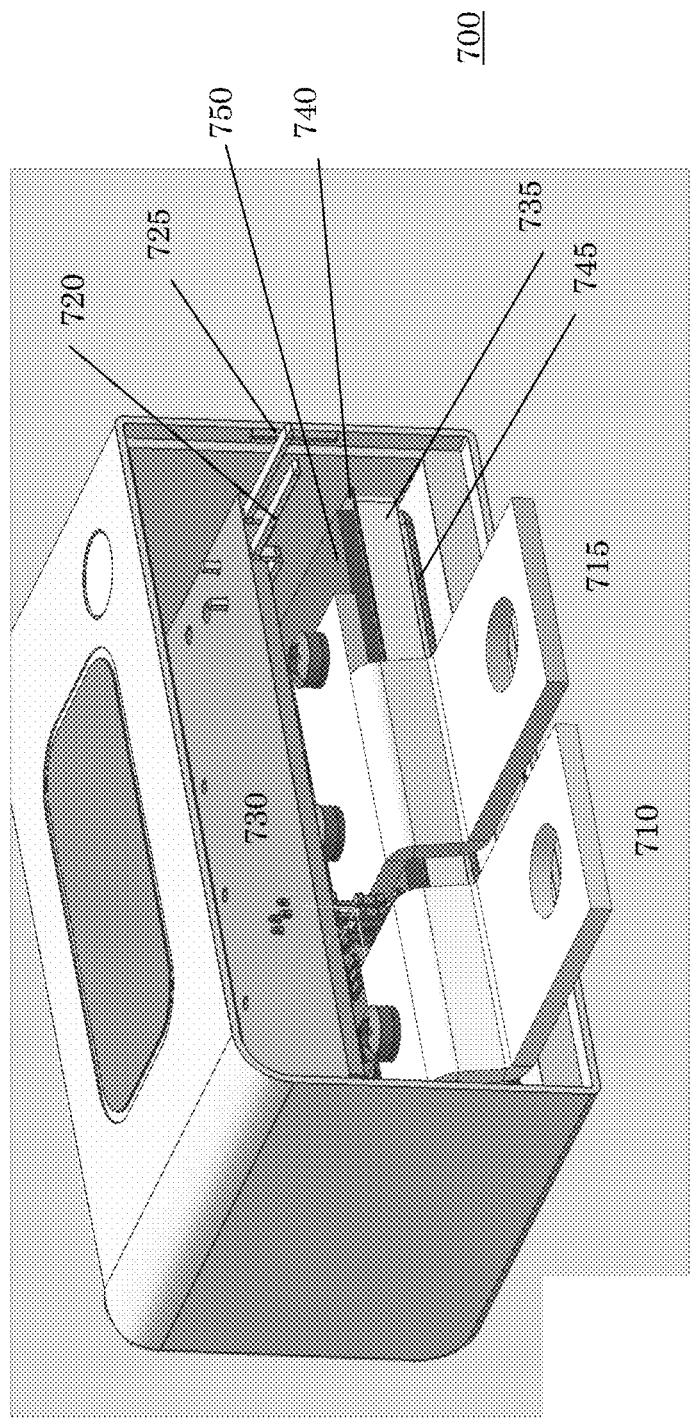
FIG. 7 shows an example internal view of a quasi-diode device in accordance with one or more disclosed embodiments.

FIG. 7 shows an example internal view of a quasi-diode module 700 in accordance with one or more disclosed embodiments with a front surface or wall removed. This view of the a quasi-diode module 700 shows a BN connector 710, a BATT connector 715, a ground pin 720, a EN_Q pin 725, a control board 730, a heat sink 735, a thermal pad 740, a rubber grommet 745, and a power board 750.

Figure 8:
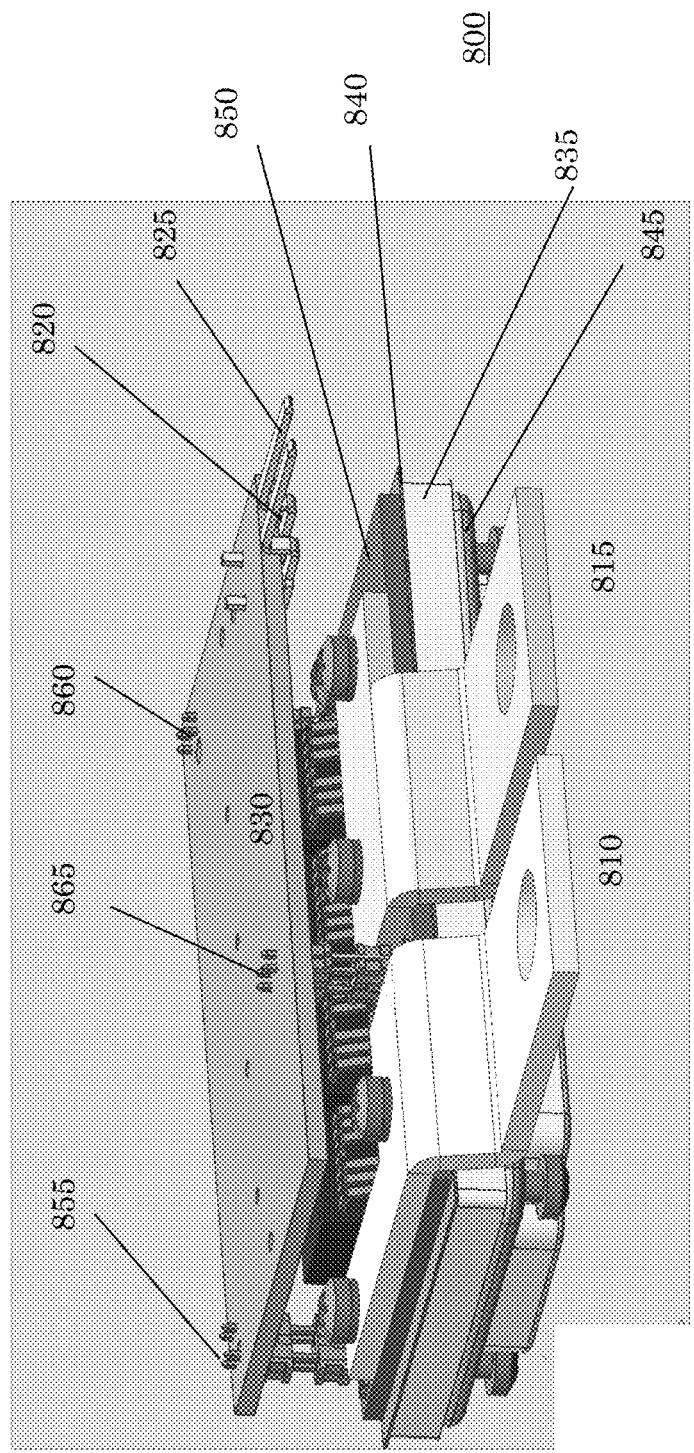
FIG. 8 shows an example view of a quasi-diode device in accordance with one or more disclosed embodiments with outer casing removed.

FIG. 8 shows an example view of a quasi-diode module 800 in accordance with one or more disclosed embodiments with an outer casing removed. This view of the a quasi-diode module 800 shows a BN connector 810, a BATT connector 815, a ground pin 820, a EN_Q pin 825, a control board 830, a heat sink 835, a thermal pad 840, a rubber grommet 845, a power board 850, a BN connector 855, a BATT connector 860 and an output voltage (for a gate of the FETs) connector 865.

Figure 9:
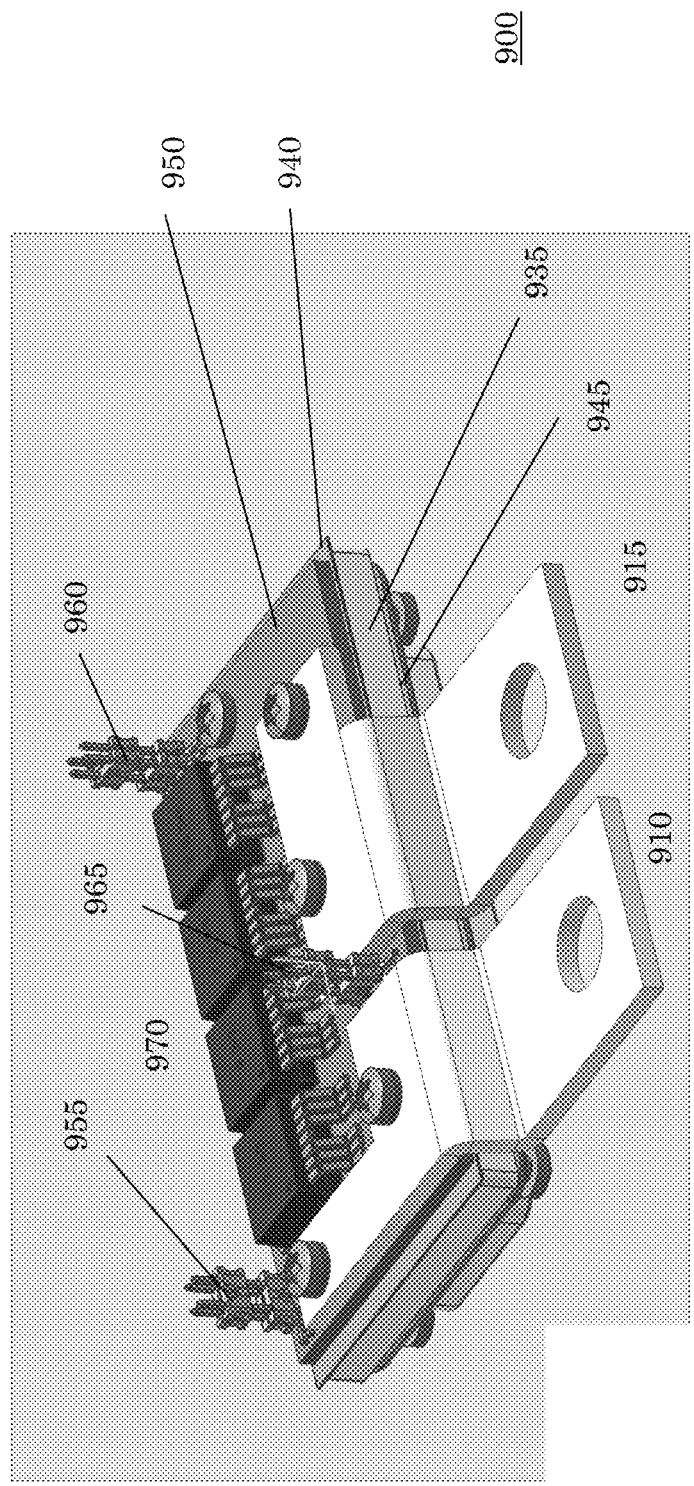
FIG. 9 shows an example view of a quasi-diode device in accordance with one or more disclosed embodiments with outer casing and cover removed.

FIG. 9 shows an example view of a quasi-diode module 900 in accordance with one or more disclosed embodiments with outer casing and a control board removed. This view of the a quasi-diode module 900 shows a BN connector 910, a BATT connector 915, a heat sink 935, a thermal pad 940, a rubber grommet 945, a power board 950, a BN connector 955, a BATT connector 960, an output voltage (for a gate of the FETs) connector 965 and FETs 970.

Although features and elements are described above in particular combinations, each feature or element can be used alone without the other features and elements or in various combinations with or without other features and elements.

What is claimed is:

1. A device, comprising:
   a plurality of field effect transistor (FETs) electrically connected between a vehicle electrical system and a battery and starter circuit; and
   a boost converter circuit that provides a gate voltage for the plurality of FETs greater than a source voltage for the plurality of FETs by a predetermined voltage;
   a fast gate discharge circuit that establishes a switchable path to ground;
   a control circuit electrically connected to the plurality of FETs, the boost converter circuit, and the fast gate discharge circuit,
   wherein the control circuit includes a first state and a second state and is configured to:
   receive a control signal from an engine control unit, and in response to the control signal being at a first level:
switches the plurality of FETs to a first state, wherein the first state allows current flow between the vehicle electrical system and the battery and starter circuit, and
turns off the boost converter circuit,
in response to the control signal being a second level:
turns on the boost converter circuit, and
switches the plurality of FETs to a second state, wherein the second state allows current flow from the battery and starter circuit to the vehicle electrical system.

2. The device according to claim 1, wherein current flow is prohibited from flowing from the vehicle electrical system to the battery and starter circuit on a condition that the control signal is at the second level.

3. The device according to claim 1, the control circuit further comprising a filtering circuit configured to provide standard filtering, and overvoltage, overcurrent, and reverse battery protection for the vehicle electrical system and the battery and starter circuit.

4. The device according to claim 3, wherein the filtering circuit is electrically connected to the boost converter circuit.

5. The device according to claim 4, the control circuit further comprising a protection circuit electrically connected to the boost converter circuit, the protection circuit is configured to turn off the plurality of FETs upon detection of a short circuit.

6. The device according to claim 5, wherein the short circuit is detected when a voltage at the battery and starter circuit exceeds a voltage at the vehicle electrical system by a short circuit threshold.

7. The device according to claim 6, wherein the short circuit threshold is attained when the voltage at the battery and starter circuit is equal to or higher than half the voltage at the vehicle electrical system.

8. The device according to claim 5, wherein the fast gate discharge circuit is electrically connected to the protection circuit and the fast gate discharge circuit is configured to establish a path to ground in an event of a short circuit.

9. An apparatus, comprising:
a power board including a plurality of field effect transistor (FETs) electrically connected to a vehicle electrical system current and a battery and starter current; and
a control board configured to receive a control signal from an engine control unit and connected to the vehicle electrical system current and the battery and starter current, wherein
the control board comprises:
a boost converter module configured to provide a gate voltage for the plurality of FETs greater than a source voltage for the plurality of FETs by a predetermined voltage, and
a fast gate discharge module configured to establish a switchable path to ground; and
the control board is configured to output a signal to the power board, wherein
the control signal at a first level is configured to switch the plurality of FETs to a first state to allow current flow between a vehicle electrical system and a battery and starter circuit, and
turn off the boost converter module; and
the control signal at a second level is configured to switch the plurality of FETs to a second state to allow current flow from the battery and starter circuit to the vehicle electrical system, and
turn on the boost converter module.

10. The apparatus according to claim 9, wherein current flow is prohibited from flowing from the vehicle electrical system to the battery and starter circuit on a condition that the control signal is at the second level.

11. The apparatus according to claim 9, wherein the control board further comprising:
a filtering module configured to provide filtering, and overvoltage, overcurrent and reverse battery protection for the vehicle electrical system and the battery and starter circuit; and
a protection module electrically connected to the boost converter module and the fast gate discharge module via a logical circuit,
wherein in an event of a short circuit the protection module is configured to simultaneously turn off the plurality of FETs and the fast gate discharge module is configured to establish a path to ground.

12. The apparatus according to claim 11, wherein the short circuit is detected when a voltage at the battery and starter circuit exceeds a voltage at the vehicle electrical system by a short circuit threshold.

13. The apparatus according to claim 12, wherein the short circuit threshold is attained when the voltage at the battery and starter circuit is equal to or higher than half the voltage at the vehicle electrical system.

14. The apparatus according to claim 11, wherein the logical circuit is configured to output a shutdown signal upon detection of the short circuit by the protection module.

15. A method for current flow control in a dual battery system, the method comprising:
connecting a plurality of field effect transistor (FETs) between a vehicle electrical system and a battery and starter circuit;
connecting a control circuit to the plurality of FETs, wherein the control circuit comprises a boost converter circuit and a fast gate discharge circuit,
receiving a control signal from an engine control unit by the control circuit;
switching the plurality of FETs to a first state in response to the control signal being at a first level to allow current flow between the vehicle electrical system and a battery and starter circuit; and
switching the plurality of FETs to a second state in response to the control signal being at a second level to allow current flow from the battery and starter circuit to the vehicle electrical system; wherein
in the first state the method further comprises turning off the boost converter circuit and turning off the plurality of FETs, and
in the second state the method further comprises turning on the boost converter circuit to boost a gate voltage for each gate of the plurality of FETs greater than a source voltage for each source of the plurality of FETs by a predetermined voltage.

16. The method according to claim 15, wherein current flow is prohibited from flowing from the vehicle electrical system to the battery and starter circuit on a condition that the control signal is at the second level.

17. The method according the claim 15, wherein the each source of the plurality of FETs is connected to one of the vehicle electrical system and the battery and starter circuit.

18. The method according to claim 16, further comprising:

detecting a short circuit condition by determining if a voltage at the battery and starter circuit exceeds a voltage at the vehicle electrical system by a short circuit threshold;

generating a shutdown signal; and simultaneously turning off the plurality of FETs and establishing a fast gate discharge path to ground upon detection of a short circuit.

19. The method according to claim 18, wherein the short circuit threshold is attained when the voltage at the battery and starter circuit is equal to or higher than half the voltage at the vehicle electrical system.

20. The device according to claim 8, wherein in response to detecting short circuit the protection circuit simultaneously turns off the boost circuit, the plurality of FETs, and switches the fast gate discharge circuit to discharge to ground.

\* \* \* \* \*

UNITED STATES PATENT AND TRADEMARK OFFICE
CERTIFICATE OF CORRECTION

Page 1 of 1

PATENT NO. : 9,682,672 B2
APPLICATION NO. : 14/333659
DATED : June 20, 2017
INVENTOR(S) : Pompilian Tofilescu and Reginald C. Grills It is certified that error appears in the above-identified patent and that said Letters Patent is hereby corrected as shown below:

In the Specification

At Column 5, Line 46, delete "transistor 346" and insert therefor -- transistor 344 --.

At Column 5, Line 48, delete "transistor 346" and insert therefor -- transistor 344 --.

Signed and Sealed this
Nineteenth Day of January, 2021

Andrei Iancu
*Director of the United States Patent and Trademark Office*